US010840875B2

United States Patent
Plesski et al.

(10) Patent No.: US 10,840,875 B2
(45) Date of Patent: Nov. 17, 2020

(54) SURFACE ACOUSTIC WAVE DEVICES USING BERYLLIUM CONDUCTORS

(71) Applicant: Resonant Inc., Santa Barbara, CA (US)

(72) Inventors: Viktor Plesski, Gorgier (CH); Julius Koskela, Helsinki (FI)

(73) Assignee: Resonant Inc., Goleta, CA (US)

( * ) Notice: Subject to any disclaimer, the term of this patent is extended or adjusted under 35 U.S.C. 154(b) by 41 days.

(21) Appl. No.: 16/163,248

(22) Filed: Oct. 17, 2018

(65) Prior Publication Data

US 2019/0123710 A1    Apr. 25, 2019

Related U.S. Application Data

(60) Provisional application No. 62/576,312, filed on Oct. 24, 2017.

(51) Int. Cl.
| | | |
|---|---|---|
| *H03H 9/02* | (2006.01) | |
| *H03H 3/08* | (2006.01) | |
| *H03H 9/145* | (2006.01) | |
| *H03H 9/25* | (2006.01) | |
| *H01L 41/332* | (2013.01) | |
| *H03H 9/64* | (2006.01) | |
| *H01L 41/08* | (2006.01) | |
| *H01L 41/313* | (2013.01) | |

(52) U.S. Cl.
CPC ....... *H03H 9/02559* (2013.01); *H01L 41/332* (2013.01); *H03H 3/08* (2013.01); *H03H 9/02574* (2013.01); *H03H 9/14541* (2013.01); *H03H 9/25* (2013.01); *H03H 9/6406* (2013.01); *H03H 9/6433* (2013.01); *H01L 41/0815* (2013.01); *H01L 41/313* (2013.01)

(58) Field of Classification Search
CPC .. H03H 9/02574; H03H 3/08; H03H 9/14541; H03H 9/02559; H03H 9/6406; H03H 9/6433; H03H 9/25; H01L 41/332; H01L 41/313; H01L 41/0815
USPC ........................................ 333/133, 193–196
See application file for complete search history.

(56) References Cited

U.S. PATENT DOCUMENTS

| | | |
|---|---|---|
| 4,890,369 A | 1/1990 | Tanski |
| 6,037,847 A | 3/2000 | Ueda et al. |
| 2006/0103486 A1* | 5/2006 | Ruile ................. H03H 9/02834 333/133 |

(Continued)

FOREIGN PATENT DOCUMENTS

JP    2008244523 A   * 10/2008

OTHER PUBLICATIONS

Machine English Translation of JP2008244523A published on Oct. 2008 (Year: 2008).*

(Continued)

*Primary Examiner* — Rakesh B Patel
*Assistant Examiner* — Jorge L Salazar, Jr.
(74) *Attorney, Agent, or Firm* — Socal IP Law Group LLP; John E. Gunther

(57) ABSTRACT

Acoustic wave devices and methods of fabricating acoustic wave devices. A device includes a piezoelectric substrate and a conductor pattern formed on a surface of the piezoelectric substrate. The conductor pattern includes an interdigitated transducer (IDT) of a surface acoustic wave (SAW) resonator. The conductor pattern includes a substantially beryllium layer proximate the surface of the piezoelectric substrate.

28 Claims, 9 Drawing Sheets

(56) References Cited

U.S. PATENT DOCUMENTS

2011/0199168 A1* 8/2011 Kadota .............. H03H 9/02559
333/195
2011/0237204 A1* 9/2011 Jamneala ............... H03H 9/587
455/73
2016/0036414 A1* 2/2016 Hamaoka ................. H03H 9/56
333/133

OTHER PUBLICATIONS

Kawachi, O. et al., "Optimum cut of LiTaO3 for high performance leaky surface acoustic wave filters," IEEE Ultrasonics Symposium, 1996, pp. 71-75.

Kawachi, O, et al. "Optimal cut for leaky SAW on LiTaO/sub 3/ for high performance resonators and filters." IEEE Transactions on Ultrasonics, Ferroelectrics and Frequency Control, Sep. 2001, vol. 48, No. 5, pp. 1442-1448.

Materion, "Data Sheet: Acoustic Properties of Beryllium," https://materion.com/-/media/files/beryllium/engineering-design/acoustic-properties-of-beryllium_materion.pdf, accessed Jun. 4, 2018.

* cited by examiner

SURFACE ACOUSTIC WAVE DEVICES USING BERYLLIUM CONDUCTORS

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

This patent claims priority from the provisional patent application 62/576,312, filed Oct. 24, 2017, entitled SAW RESONATORS WITH BERYLLIUM ELECTRODES.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low insertion loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is less than a defined value such as 1 dB, 2 dB, or 3 dB. A "stop-band" may be defined as a frequency range where the insertion loss of a filter is greater than a defined value such as 20 dB, 30 dB, 40 dB, or greater depending on application.

RF filters are used in communications systems where information is transmitted over wireless links. For example, RF filters may be found in the RF front-ends of base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

Throughout this description, elements appearing in figures are assigned three-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figures 1A, 1B:
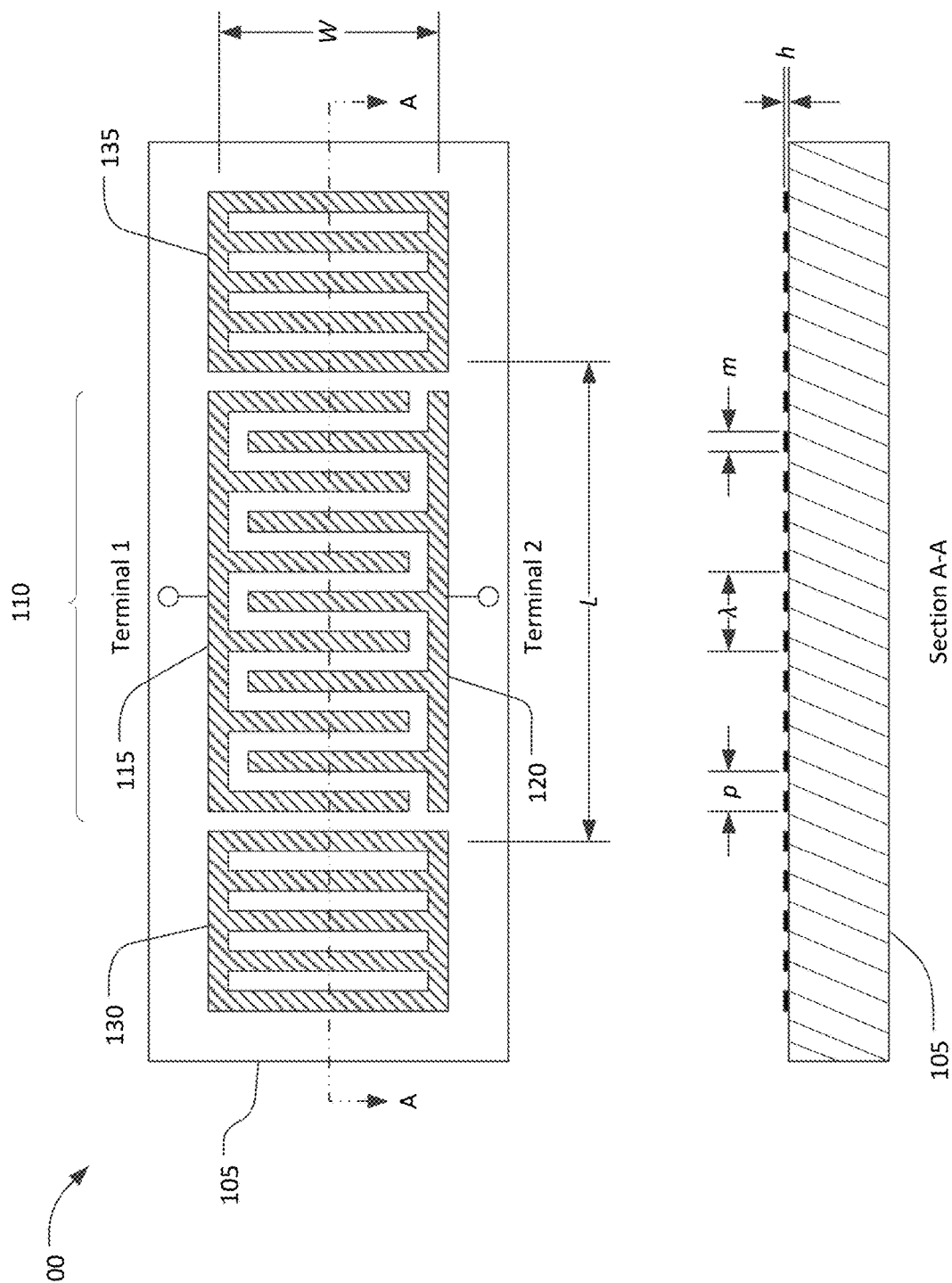
FIG. 1A is a simplified schematic plan view of a surface acoustic wave (SAW) resonator.
FIG. 1B is a simplified schematic cross-sectional view of a SAW resonator.

FIG. 1A and FIG. 1B show a simplified schematic top view and cross-sectional view, respectively, of a surface acoustic wave (SAW) resonator 100. SAW resonators such as the SAW resonator 100 are used in a variety of RF filters including band-reject filters, band-pass filters, duplexers, and multiplexers.

The SAW resonator 100 is made up of a thin film conductor pattern formed on a surface of a substrate 105. In some devices, a thin intermediate layer may be disposed between the substrate and the conductor pattern. The substrate 105 is commonly a single-crystal slab of a piezoelectric material such as quartz, lithium niobate, lithium tantalate, or lanthanum gallium silicate. The substrate 105 may be a composite substrate including a thin single-crystal wafer of the piezoelectric material bonded to another material such as silicon, sapphire, or quartz. A composite substrate is commonly used to provide a thermal expansion coefficient different from the thermal expansion coefficient of the single-crystal piezoelectric material alone.

The conductor pattern of the SAW resonator 100 includes an interdigital transducer (IDT) 110 and two Bragg reflectors 130, 135. The IDT 110 includes a first plurality of parallel fingers extending from a first busbar 115 and a second plurality of fingers extending from a second busbar 120. The first and second pluralities of parallel fingers are interleaved. The first and second busbars 115, 120 serve as the terminals (identified as "terminal 1" and "terminal 2" in FIG. 1A) of the SAW resonator 100. A radio frequency or microwave signal applied between the two busbars of the IDT 110 generates an acoustic wave on the surface of the substrate 105. As shown in FIG. 1A, the surface acoustic wave will propagate in the left-right direction.

The coupling between the IDT 110 and the surface acoustic wave is highly frequency dependent, which in turn causes the impedance or admittance of the SAW resonator to be highly frequency-dependent. Grating reflectors 130, 135 may be disposed on the substrate to confine most of the energy of acoustic waves within a particular frequency band (the "Bragg frequency stopband") to the area of the substrate occupied by the IDT 110. The grating reflectors 130, 135 consist of plural parallel fingers that may float or may be connected to either busbar of the IDT.

For ease of presentation in FIG. 1A, the geometric pitch (dimension p) and line width (dimension m) of the parallel fingers is greatly exaggerated with respect to the length (dimension L) and width (dimension W) of the SAW resonator 100. A typical SAW resonator has more than five parallel fingers in each grating reflector 130, 135 and many more than eleven parallel fingers in the IDT 110. In some SAW resonators, the pitch of the parallel fingers may vary within the IDT 110, and/or the pitch of the grating reflectors 130, 135 may be different from the pitch of the IDT. Similarly, the thickness (dimension h) of the fingers in FIG. 1B is greatly exaggerated.

Commonly used materials for the fingers of the IDT 110 and the grating reflectors 130, 135 are aluminum or a substantially aluminum alloy, and copper or a substantially copper alloy. Thin (relative to the total thickness of the conductors) layers of other metals, such as titanium, may be formed under and/or over the conductors to improve adhesion between the aluminum and the substrate and/or to passivate or encapsulate the conductors. In some cases, a heavier metal such as tungsten or molybdenum may be used in conjunction with aluminum to provide higher acoustic reflection from each finger. The busbars of the IDT may be made of the same or different materials as the fingers.

The admittance of the SAW resonator 100 is highly frequency-dependent. The basic behavior of SAW resonators is commonly described using the Butterworth Van Dyke (BVD) circuit model as shown in FIG. 2A. The BVD circuit model consists of a motional arm and a static arm. The motional arm includes a motional inductance $L_m$, a motional capacitance $C_m$, and a resistance $R_m$. The static arm includes a static capacitance $C_0$ and a resistance $R_0$. While the BVD model does not fully describe the behavior of an acoustic resonator, it does a good job of modeling the two primary resonances that are used to design band-pass filters, duplexers, and multiplexers (multiplexers are filters with more than 2 input or output ports with multiple pass-bands).

The first primary resonance of the BVD model is the resonance modeled by the series combination of the motional inductance $L_m$ and the motional capacitance $C_m$. The second primary resonance of the BVD model is the anti-resonance modeled by the combination of the motional inductance $L_m$, the motional capacitance $C_m$, and the static capacitance $C_0$. In a lossless resonator ($R_m = R_0 = 0$), the frequency $F_r$ of the resonance is given by $$F_r = \frac{1}{2\pi\sqrt{L_m C_m}} \quad (1)$$

The frequency $F_a$ of the anti-resonance is given by $$F_a = F_r\sqrt{1 + \frac{1}{\gamma}} \quad (2)$$

where $\gamma = C_0/C_m$ is a characteristic of the substrate upon which the SAW resonator is fabricated. $\gamma$ is dependent on both the material and the orientation of the crystalline axes of the substrate, as well as the physical design of the IDT.

The frequencies of the resonance and anti-resonance depend on at least the pitch of the parallel fingers in the IDT, the choice of substrate material, the crystallographic orientation of the substrate material, the material used for the IDT fingers, and the pitch, width, and thickness (dimensions p, m, and h, respectively, in FIG. 1A and FIG. 1B) of the IDT fingers. The frequencies of the resonance and the anti-resonance may also depend on the material and thickness of a dielectric over-layer (not shown in FIG. 1B) that may be deposited over the IDT fingers.

Figure 2B:
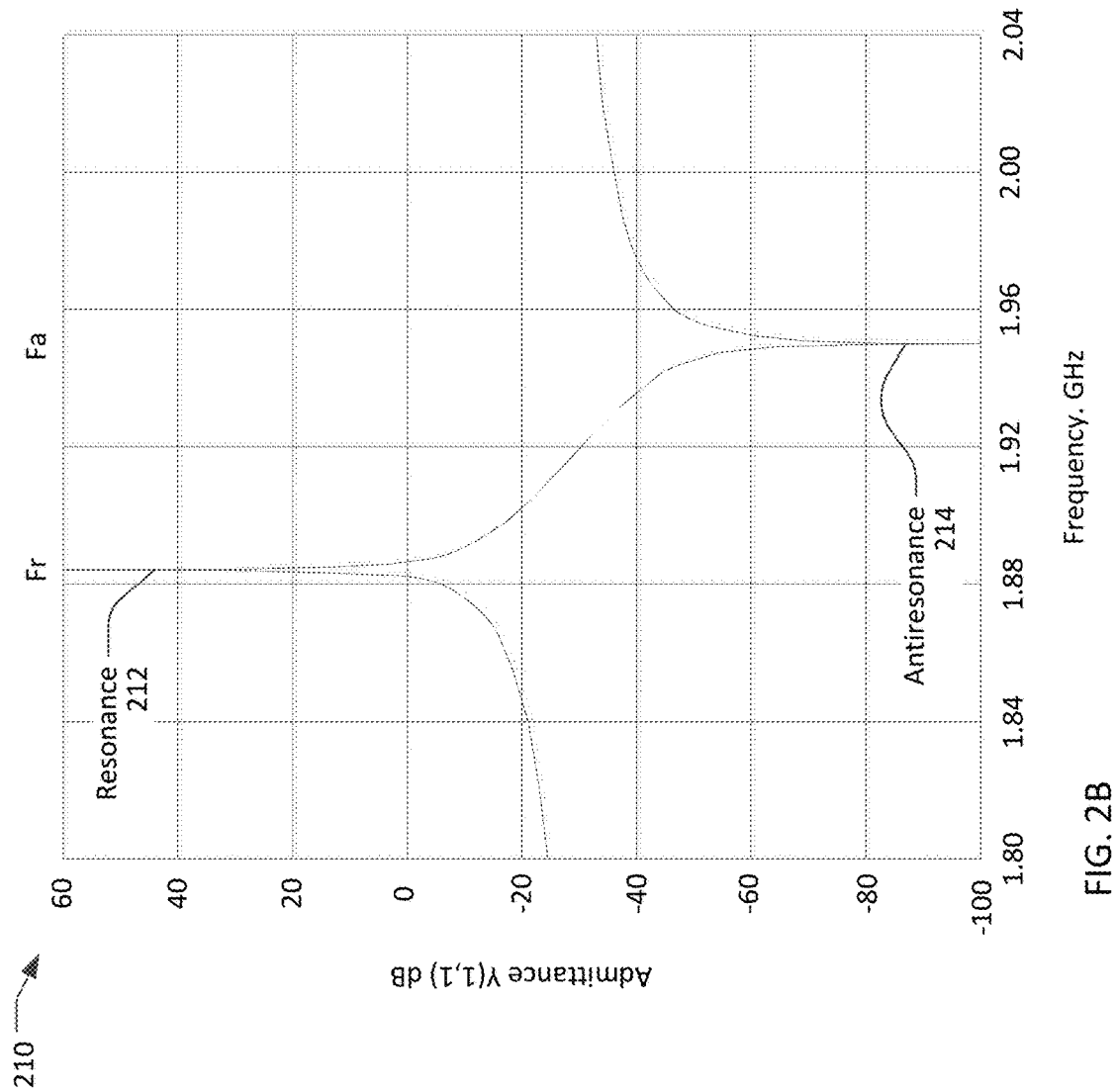
FIG. 2B is graph of the admittance of a lossless SAW resonator modeled using the equivalent circuit of FIG. 2A with $R_0=R_m=0$.
Figure 2A:
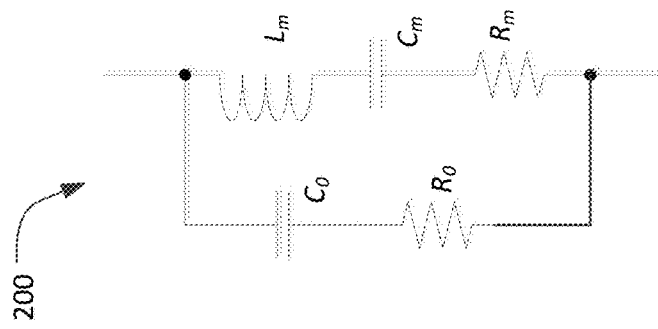
FIG. 2A is an equivalent circuit of a SAW resonator.

FIG. 2B is a plot of the magnitude of the admittance of a theoretical lossless acoustic resonator represented by a BVD model with $R_0 = R_m = 0$. The admittance exhibits a resonance 212 where the admittance of the resonator approaches infinity, and an anti-resonance 214 where the admittance of the resonator approaches zero. In over-simplified terms, the theoretical lossless acoustic resonator can be considered a short circuit at the frequency $F_r$ of the resonance 212 and an open circuit at the frequency $F_a$ of the anti-resonance 214. The frequencies of the resonance 212 and the anti-resonance 214 are representative, and a resonator may be designed for other frequencies.

Figure 3:
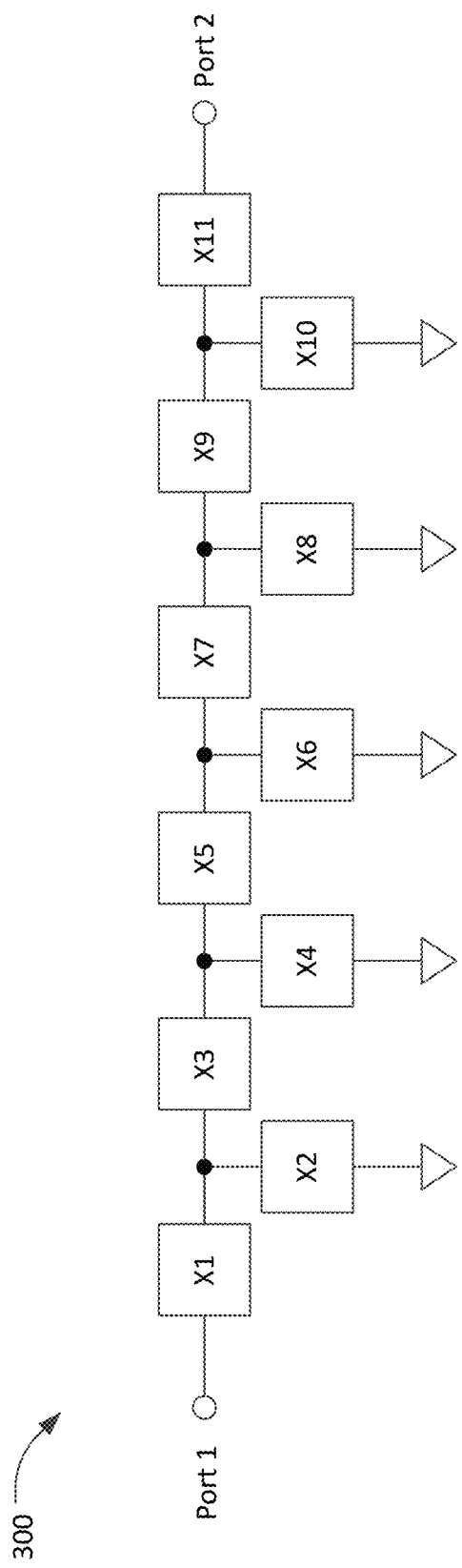
FIG. 3 is a schematic diagram of an exemplary band-pass filter circuit incorporating SAW resonators.

FIG. 3 shows a schematic diagram of an exemplary band-pass filter circuit 300 incorporating eleven SAW resonators, labeled X1 through X11, arranged in what is commonly called a "ladder" configuration. The filter circuit 300 may be, for example, a transmit filter or a receive filter for incorporation into a communications device. The filter circuit 300 includes six series resonators (X1, X3, X5, X7, X9, and X11) connected in series between an input (Port 1) and an output (Port 2). The filter circuit 300 includes five shunt resonators (X2, X4, X6, X8, and X10) connected between junctions of adjacent series resonators and ground. The use of eleven SAW resonators, six series resonators, and five shunt resonators is exemplary. Each of the eleven resonators X1-X11 may be comprised of an interdigital transducer and grating reflectors as shown in FIG. 1. Each shunt resonator X2, X4, X6, X8, and X10 has a low impedance at its respective motional resonant frequency, and each series resonator X1, X3, X5, X7, X9, and X11 has a high impedance at its respective anti-resonant frequency. With proper selection of the parameters of each resonator, the filter circuit 300 can provide low insertion loss over a defined passband and high insertion loss in one or more stop bands.

FIG. 2B previously showed the admittance of a hypothetical lossless SAW resonator. However, physical SAW resonators have losses including resistive losses in the conductors, viscous losses in the conductors and the substrate, propagation losses due to power leakage into bulk acoustic waves (BAWs), and three-dimensional effects such as busbar radiation.

Surface acoustic wave propagation losses are due to coupling of energy into bulk acoustic waves at surface perturbations, such as the conductors. The bulk-acoustic waves that can propagate in a piezoelectric substrate are defined by material characteristics of the substrate, such as mass density and elastic, dielectric and piezoelectric constants. The existence and properties of surface waves, and the excitation characteristics of bulk acoustic waves are further determined by the propagation direction and the orientation of that surface, commonly referred to as the crystal cut.

The complex interaction of the substrate and the IDT fingers can be simulated through computational means, such as a finite-element analysis tool. The "leakage", or power lost as slow shear BAWs, seems to coarsely follow the formula:

$$P_{leakage} \approx |C_0(\mu,v) + C_1(\mu,v) \ast \rho h|^2 \quad (3)$$

Where $P_{leakage}$=power lost as BAWs;

$C_0$ and $C_1$=coefficients dependent on crystal cut ($\mu$) and SAW velocity (v);

$\rho$=conductor material density;

and h=conductor thickness.

Here, the first term $C_0(\mu, v)$ can be interpreted to represent direct BAW excitation by the voltage applied to the IDT fingers, and the second term $C_1(\mu, v)\rho h$ to represent mechanical interaction with the IDT fingers, commonly termed "mass loading". As the name implies, mass loading depends primarily on the finger mass. However, also the shape of the fingers and the elastic properties of the metal have some influence. Moreover, both quantities depend on the crystal cut $\mu$ and the velocity v of the surface acoustic waves. The coefficients $c_0(\mu, v)$ and $c_1(\mu, v)$ are generally complex-valued. Most importantly, for suitable crystal-cut/SAW velocity combinations, the coefficients $c_0(\mu, v)$ and $c_1(\mu, v)$ have opposing signs. This results in the existence of an optimal finger thickness which minimises the propagation loss. Unfortunately, since SAW velocities vary with frequency, minimum propagation loss can only be achieved at a single frequency.

A common configuration for SAW resonators is a rotated Y-cut LiTaO3 substrate and aluminum or substantially aluminum alloy fingers orientated such that the acoustic wave propagates in the X direction. A configuration with a 42-degree cut angle and aluminum conductors with a thickness of 0.075λ (dimension λ in FIG. 1B) is known (Kawachi et al., "Optimum cut of LiTaO3 for high performance leaky surface acoustic wave filters", Proc, IEEE Ultrasonics Symp., 1996, pp. 71-76) to minimize propagation loss at the motional resonant frequency of a SAW resonator.

Beryllium is an electrically conductive metal that is lighter (i.e. has lower density) and stiffer than aluminum or aluminum alloys. Further, the velocity of sound in beryllium is about double the velocity of sound in aluminum. Physical properties of aluminum and beryllium are summarized in Table 1.

TABLE 1

| Metal | Density [kg/m$^3$] | Stiffness [10$^{10}$ N/m] | | Velocity [m/s] | | Conductivity [10$^6$ S/m] |
|---|---|---|---|---|---|---|
| | | $C_{11}$ | $C_{44}$ | $v_L$ | $v_T$ | |
| Aluminum | 2695 | 11.1 | 2.5 | 6417.7 | 3045.7 | 36.9 |
| Beryllium | 1850 | 28.7608 | 13.905 | 12469 | 8669.6 | 27.0 |

Importantly, the acoustic or viscous losses in beryllium are about 1% of the losses of aluminum at microwave frequencies (Materion Inc., "Acoustic Properties of Beryllium", www.materion.com). SAW resonators with substantially beryllium IDT conductors can have lower viscous losses than comparable SAW resonators using aluminum conductors. In this context, a conductor layer is considered "substantially beryllium" if the conductor layer is formed of pure beryllium, beryllium with trace amounts of one or more other elements, or a beryllium alloy including small percentages of other elements. To take advantage of the low acoustic losses in beryllium, the substantially beryllium conductor layer may be proximate the surface of the piezoelectric substrate. In this context, "proximate" has its conventional meaning of "near to" but does not require the substantially beryllium conductor layer to be immediately adjacent the substrate surface. A substantially beryllium conductor layer may be formed directly on a surface of a piezoelectric substrate. A substantially beryllium conductor layer may be separated from the surface of the substrate by one or more thin (relative to the thickness of the substantially beryllium layer) layers of other materials and still be considered "proximate" the substrate surface. In addition, a conductor structure including a substantially beryllium layer and one or more thin layers of other materials is still considered "substantially beryllium" if the viscous losses in the other material layers are small compared to the viscous loss in the substantially beryllium layer. For example, one or more thin layers formed between a substantially beryllium layer and a substrate may include an adhesion layer to improve adhesion between the substantially beryllium layer and the substrate and/or a barrier layer to prevent chemical or physical interaction between the substantially beryllium layer and the substrate.

Since the conductivity of beryllium is lower than that of aluminum, the thickness (dimension h in FIG. 1A) of substantially beryllium IDT conductors must be about 36% greater than the thickness of aluminum conductors to have the same resistive loss. Even with the increased thickness, substantially beryllium conductors will have slightly less mass than aluminum conductors having the same resistive loss. Thus, the use of substantially beryllium conductors can reduce viscous losses in a SAW resonator without necessarily increasing resistive or propagation losses.

The following examples illustrate the SAW resonator performance improvement possible using substantially beryllium conductors instead of conventional aluminum conductors. Each of these examples provides results from simulation of SAW resonator structures using a finite element analysis tool. In all cases, the resonators are formed on rotated Y-cut LiTaO3 substrates with the IDT fingers oriented to cause acoustic wave propagation in the X direction. The IDT finger pitch (dimension p in FIG. 1A) is 1 micron (micro-meter), the wavelength λ=2p=2 microns, the metallization ratio (ratio of dimension m to dimension p in FIG. 1A) of the IDT fingers is 0.5, the width of the IDT (dimension W in FIG. 1A) is 40 microns, the number of IDT fingers is 121, and the number of fingers in each Bragg reflector is 40. The conductor thickness (dimension h in FIG. 1A) was optimized (in steps of roughly 0.5% of the wavelength k) to satisfy a different criterion for each example.

Example 1

Figure 4:
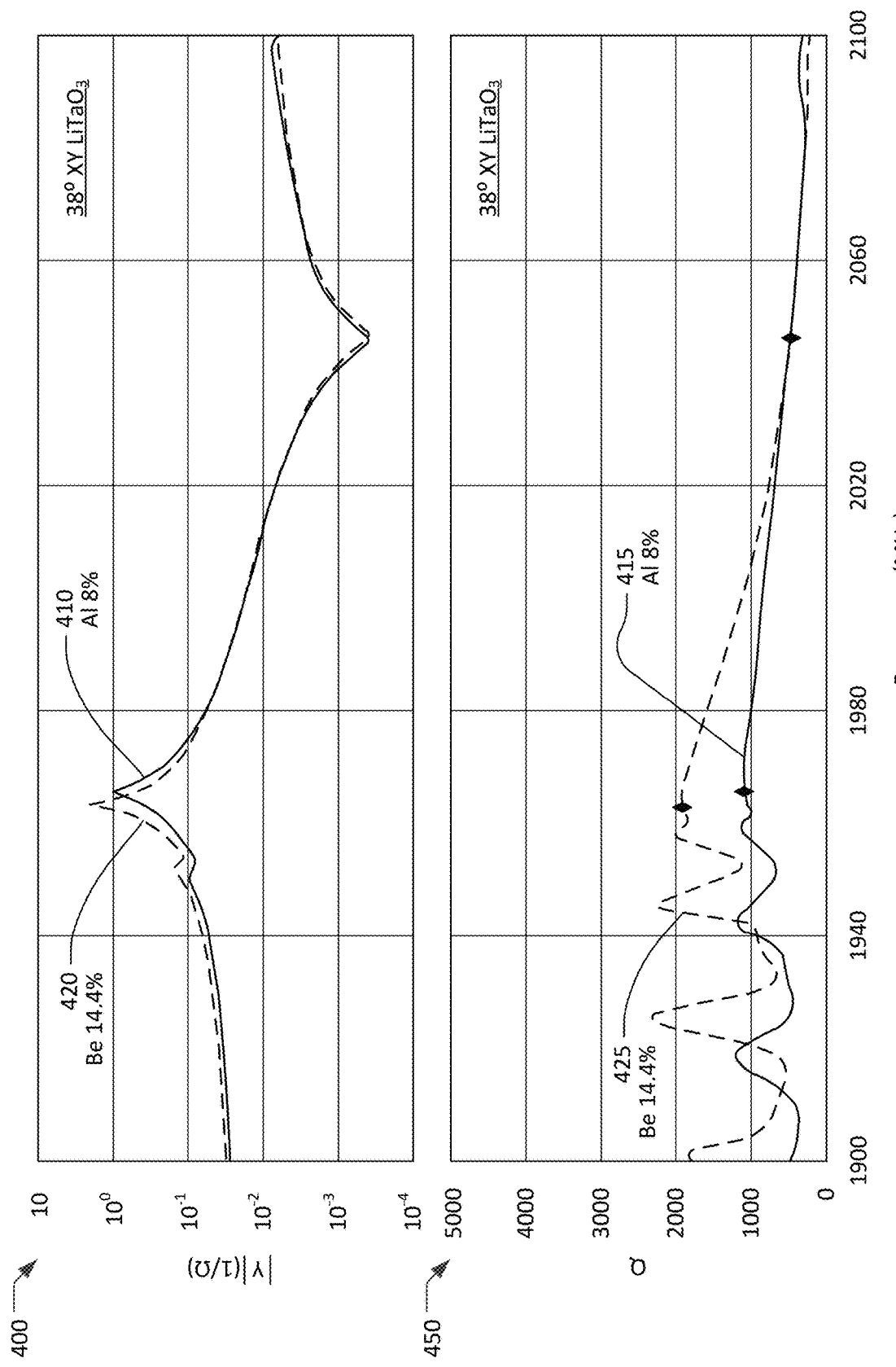
FIG. 4 is a chart comparing the admittance and Q-factor of SAW resonators with aluminum and beryllium conductors.

FIG. 4 contains two charts comparing the performance of SAW resonators formed on rotated Y-cut LiTaO3 substrates with a cut angle of 38 degrees. The upper chart 400 compares the admittances of resonators with aluminum conductors and substantially beryllium conductors. In both cases, the conductor thickness is optimized for maximum Q at the motional resonant frequency of the resonator. The solid line 410 is a plot of the magnitude of the admittance versus frequency for a resonator with aluminum conductors having a thickness of 8% of the wavelength λ. The dashed line 420 is a plot of the magnitude of the admittance versus frequency for a resonator with substantially beryllium conductors with a thickness of 14.4% of the wavelength λ.

The lower chart 450 compares the Qs of the two resonators as a function of frequency. The solid line 415 is a plot of Q versus frequency for the resonator with aluminum conductors. The dashed line 425 is a plot of Q versus frequency for the resonator with substantially beryllium conductors. Black diamonds superimposed on the plots mark the resonant and anti-resonant frequencies. The Q of the resonator with aluminum conductors is about 1100 at the resonance frequency and about 500 at the anti-resonance frequency. The Q of the resonator with substantially beryllium conductors is about 1900 at the resonance frequency and about 500 at the anti-resonance frequency. The higher Q of the resonator with substantially beryllium conductors, compared to the resonator with aluminum conductors, indicates lower total losses at the resonance frequency.

Example 2

Figure 5:
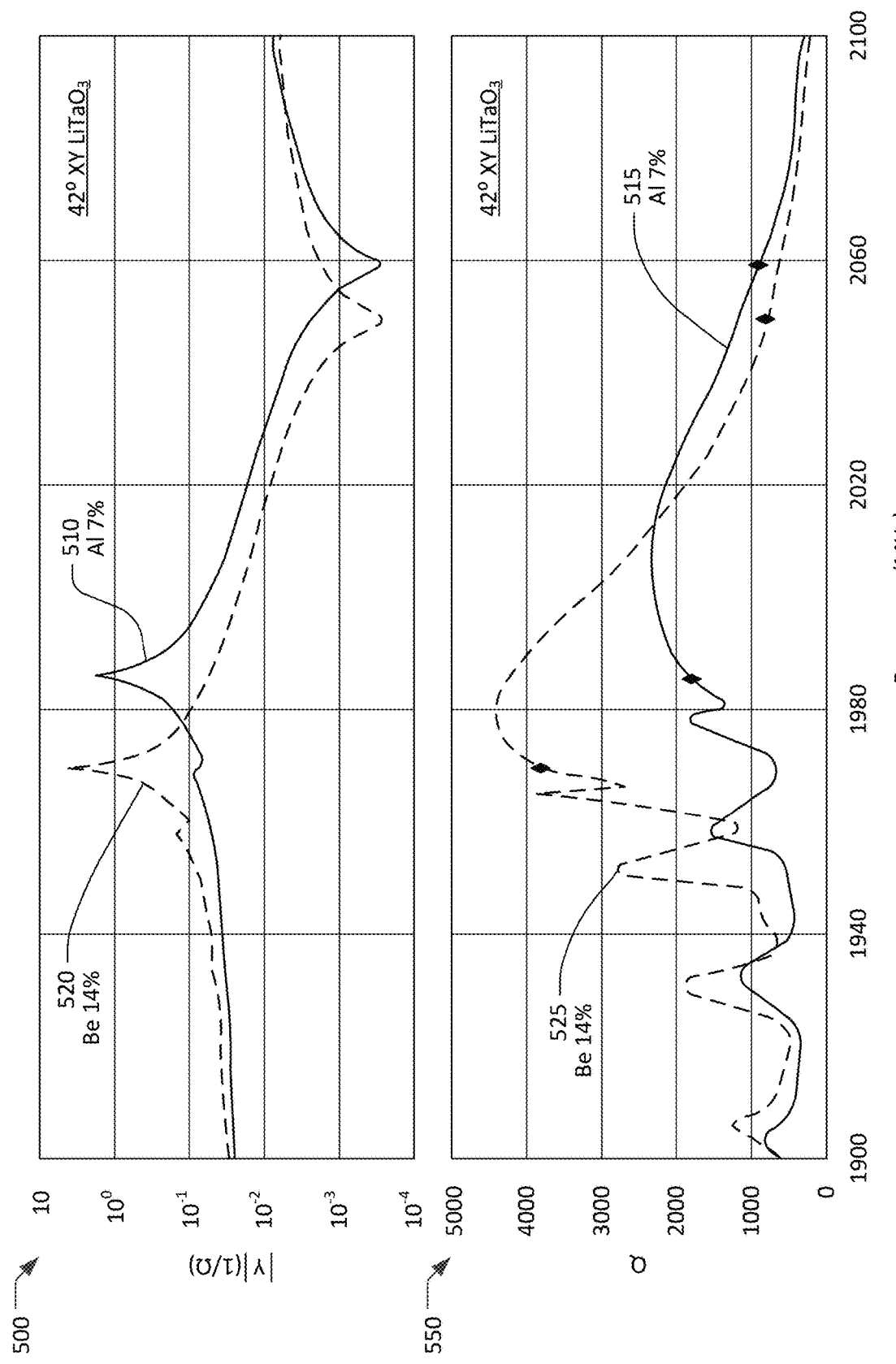
FIG. 5 is a chart comparing the admittance and Q-factor of SAW resonators with aluminum and beryllium conductors.

FIG. 5 contains two charts comparing the performance of SAW resonators formed on rotated Y-cut LiTaO3 substrates with a cut angle of 42 degrees. The upper chart 500 compares the admittances of resonators with aluminum conductors and substantially beryllium conductors. In both cases, the conductor thickness is optimized (within about 0.5% of the wavelength λ) for maximum Q at the resonance frequency of the resonator. The solid line 510 is a plot of the magnitude of the admittance versus frequency for a resonator with aluminum conductors having a thickness of 7% of the wavelength λ. The dashed line 520 is a plot of the magnitude of the admittance versus frequency for a resonator with substantially beryllium conductors with a thickness of 14% of the wavelength λ.

The lower chart 550 compares the Q of the two resonators as a function of frequency. The solid line 515 is a plot of Q versus frequency for the resonator with aluminum conductors. The dashed line 525 is a plot of Q versus frequency for the resonator with beryllium conductors. Black diamonds superimposed on the plots mark the resonance and anti-resonance frequencies. The Q of the resonator with aluminum conductors is about 1800 at the resonance frequency and about 900 at the anti-resonance frequency. The Q of the resonator with substantially beryllium conductors is about 3800 at the resonance frequency and 800 at the anti-resonance frequency. The higher Q of the resonator with substantially beryllium conductors, compared to the resonator with aluminum conductors, indicates lower total losses at the resonance frequency.

Example 3

Figure 6:
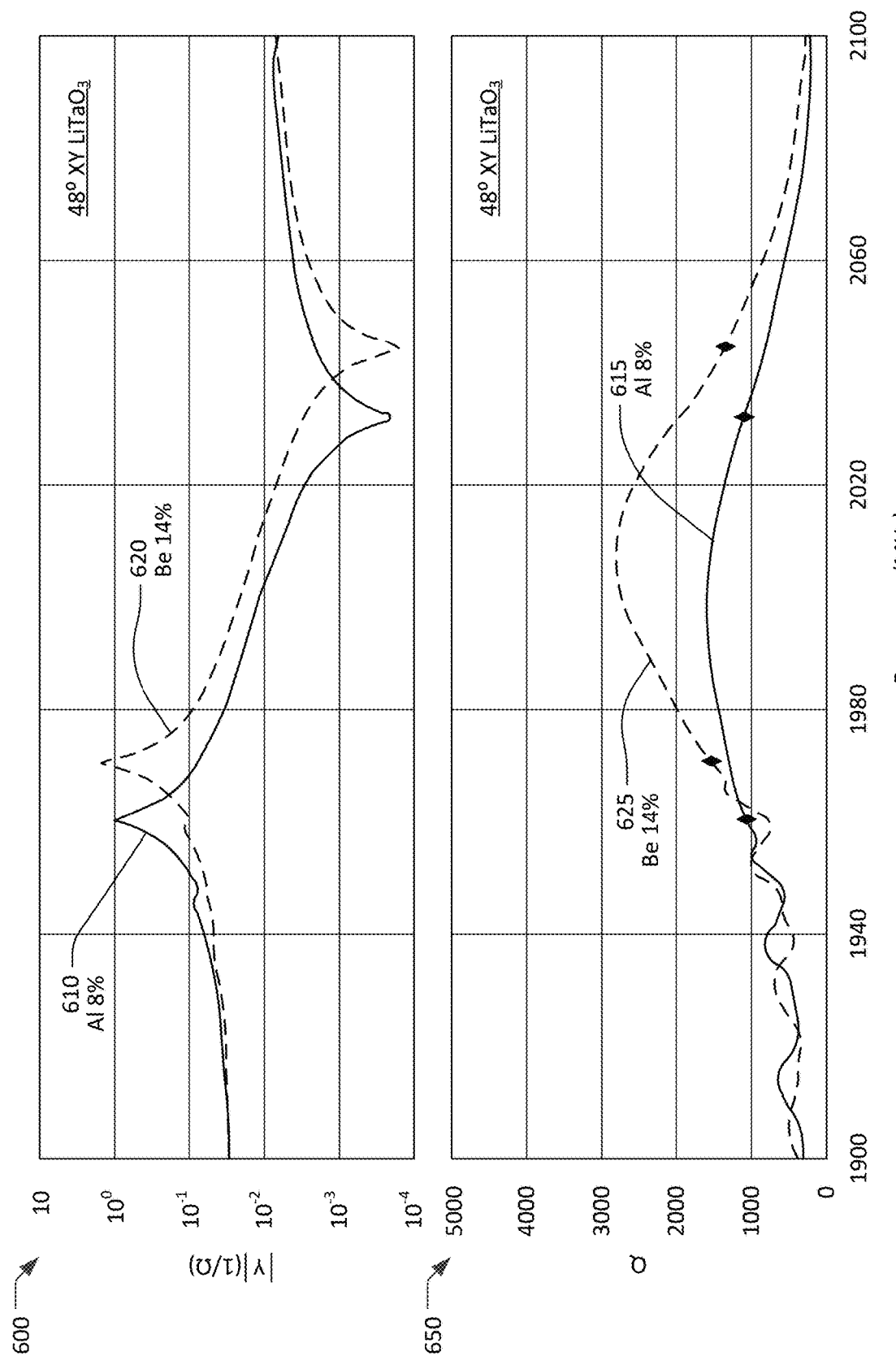
FIG. 6 is a chart comparing the admittance and Q-factor of SAW resonators with aluminum and beryllium conductors.

FIG. 6 contains two charts comparing the performance of SAW resonators formed on rotated Y-cut LiTaO3 substrates with a cut angle of 48 degrees. The upper chart 600 compares the admittance of resonators with aluminum conductors and substantially beryllium conductors. In both cases, the conductor thickness is optimized for maximum Q at the anti-resonance frequency of the resonator. In both cases, this optimization also provides approximately equal Q at the resonance and anti-resonance frequencies. The solid line 610 is a plot of the magnitude of the admittance versus frequency for a resonator with aluminum conductors having a thickness of 8% of the wavelength λ. The dashed line 620 is a plot of the magnitude of the admittance versus frequency for a resonator with substantially beryllium conductors with a thickness of 14% of the wavelength λ.

The lower chart 650 compares the Q of the two resonators as a function of frequency. The solid line 615 is a plot of Q versus frequency for the resonator with aluminum conductors. The dashed line 625 is a plot of Q versus frequency for the resonator with substantially beryllium conductors. Black diamonds superimposed on the plots mark the resonance and anti-resonance frequencies. The Q of the resonator with aluminum conductors is about 1100 at the resonance frequency and at the anti-resonance frequency. The Q of the resonator with substantially beryllium conductors is about 1600 at the resonance frequency and 1400 at the anti-resonance frequency. In this example, the resonator with substantially beryllium conductors has higher Q, and thus lower total losses, than the resonator with aluminum conductors over the frequency range from the resonance frequency to the anti-resonance frequency.

Other Conductor Configurations

Figures 7A, 7B, 7C:
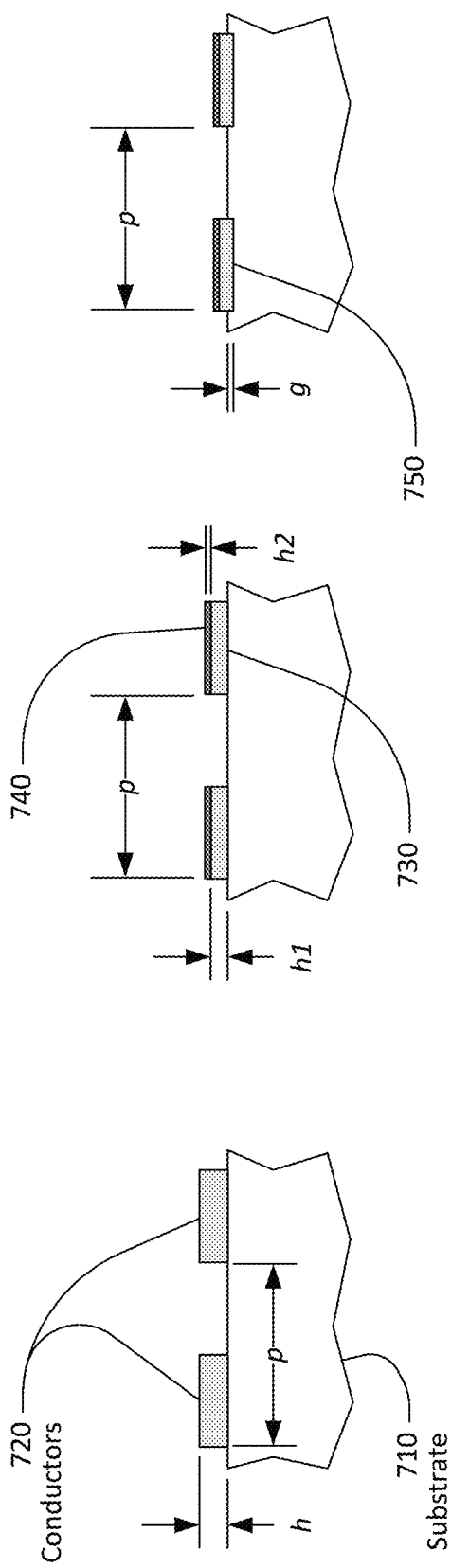
FIG. 7A is a simplified schematic cross-sectional view of a portion of a SAW resonator.
FIG. 7B is a simplified schematic cross-sectional view of a portion of a SAW resonator with multi-layer conductors.
FIG. 7C is a simplified schematic cross-sectional view of a portion of a SAW resonator with multilayer conductors on a grooved substrate.

FIG. 7A is a cross-sectional view of two IDT conductors 720 on a substrate 710. The conductors 720 are formed from a single conductive metal or metal alloy with a thickness h and pitch p. This conductor configuration was previously shown in FIG. 1B and was assumed in the three examples discussed in the previous paragraphs. A thin layer of another material, such as titanium, may be disposed under and/or over the conductors to improve adhesion and/or protect the surface of the conductors. Such thin layers, if present, are not shown in FIG. 7A.

FIG. 7B is a cross-sectional view of multilayer IDT conductors on a substrate. Each conductor includes a substantially beryllium layer 730, having a thickness h1, proximate the substrate. A thin layer of another material (not shown), such as titanium, may be disposed under the substantially beryllium layer to improve adhesion and/or protect the surface of the conductors. A conduction enhancement layer 740, having a thickness h2, is formed on top of the substantially beryllium layer. The conduction enhancement layer 740 may be a metal, such as gold, copper, or aluminum, having higher electrical conductivity than beryllium. The overall thickness h1+h2 of a multilayer conductor structure can be less than the thickness of a beryllium-only conductor while still providing low viscous and resistive losses.

FIG. 7C is a cross-sectional view of multilayer IDT conductors formed in shallow grooves 750 in a piezoelectric substrate. The multilayer conductor structure is similar to the conductors of FIG. 7B. Each conductor includes a substantially beryllium layer, having a thickness h1, proximate the substrate. A thin layer of another material (not shown), such as titanium, may be disposed under the substantially beryllium layer to improve adhesion and/or protect the surface of the conductors. A conduction enhancement layer, having a thickness h2, is formed on top of the beryllium layer. The depth g of the grooves may be less than or comparable to the thickness h1. The multilayer conductor structure results in low viscous and resistive losses. Forming the conductors in grooves in the substrate increases electro-acoustic coupling and results in a larger frequency different between the resonance and anti-resonance frequencies of a resonator.

Figure 8:
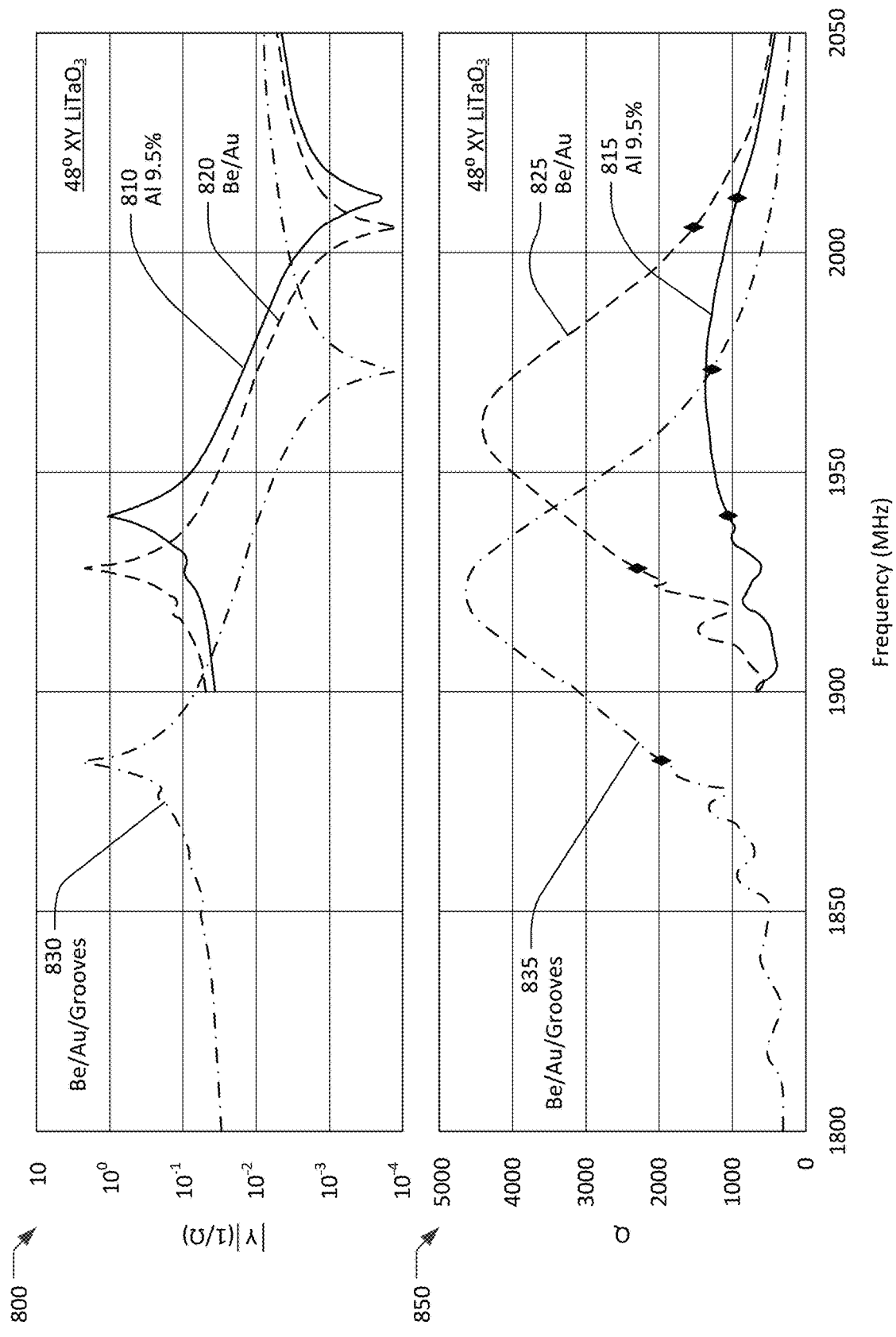
FIG. 8 is a chart comparing the admittance and Q-factor of SAW resonators with aluminum and multi-layer conductors.

FIG. 8 contains two charts comparing the performance of SAW resonators formed on rotated Y-cut LiTaO3 substrates with a cut angle of 48 degrees. In all cases, the conductor thickness is optimized (within about 0.5% of the wavelength λ) for balanced (i.e. equal) Q at the resonance and anti-resonance frequencies of the resonator. The upper chart 800 compares the admittance of resonators with three different conductor configurations. The solid line 810 is a plot of the magnitude of the admittance versus frequency for a resonator with aluminum conductors having a thickness of 9.5% of the wavelength λ. The dashed line 820 is a plot of the magnitude of the admittance versus frequency for a resonator with multilayer conductors including a substantially beryllium layer with a thickness of 8% of wavelength λ and a gold conduction enhancement layer with a thickness of 1% of the wavelength λ. The dash-dot line 830 is a plot of the magnitude of the admittance versus frequency for a resonator with multilayer conductors including a substantially beryllium layer with a thickness of 8% of wavelength λ and a gold conduction enhancement layer with a thickness of 2% of the wavelength λ formed in grooves having a depth of 3% of the wavelength λ.

The lower chart 850 compares the Q of the three resonators as a function of frequency. The solid line 815 is a plot of Q versus frequency for the resonator with aluminum conductors. The dashed line 825 is a plot of Q versus frequency for the resonator with beryllium/gold conductors. The dash-dot line 835 is a plot of Q versus frequency for the resonator with beryllium/gold conductors formed in grooves. Black diamonds superimposed on the plots mark the resonance and anti-resonance frequencies.

The Q of the resonators with beryllium/gold conductors is substantially higher, and the losses corresponding lower, than the Q of the resonator with aluminum conductors over the frequency range from the resonance frequency to the anti-resonance frequency. The difference between the anti-resonance and resonance frequencies for the resonator with multilayer conductors on a flat substrate (dashed lines 820, 825) is about 77 MHz. The difference between the anti-resonance and resonance frequencies for the resonator with multilayer conductors in grooves (dash-dot lines 830, 835) is about 88 MHz. The increase in the difference between the anti-resonance and resonance frequencies is due to higher electro-acoustic coupling.

Other Resonator Configurations

The examples discussed above included Y cut LiTaO₃ substrates with cut angles of 38, 42, or 48 degrees, and substantially beryllium conductor layer thickness from 8% to 14.5% of the wavelength λ. Other resonators using substantially beryllium conductors may incorporate other substrate materials and/or other crystal planes. In particular, resonators with substantially beryllium conductors may be fabricated on Y cut LiTaO₃ substrates with cut angles from 35 degrees to 55 degrees, and substantially beryllium conductor thickness may be between 5% and 20% of the wavelength λ.

Description of Methods

Figure 9:
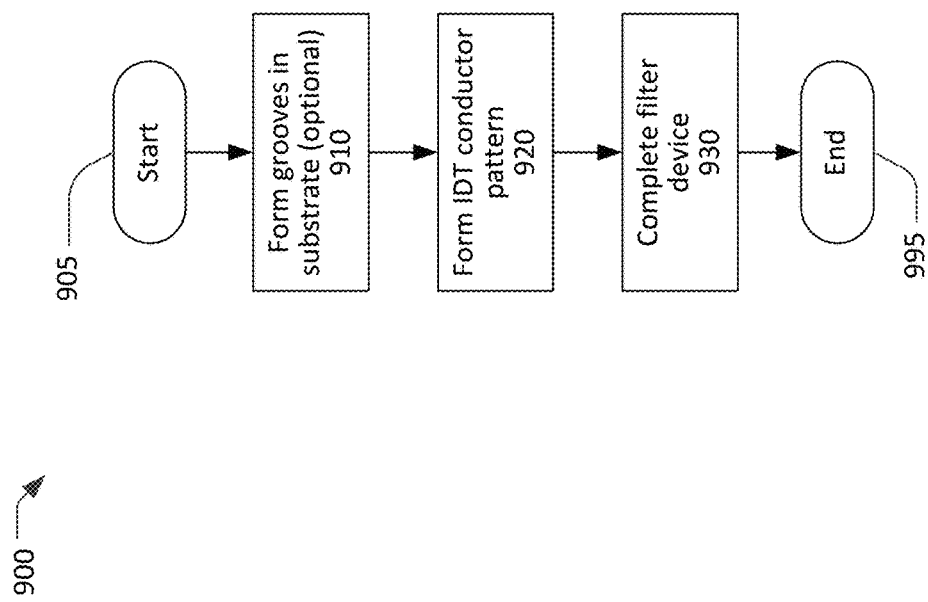
FIG. 9 is a simplified flow chart of a process for fabricating a SAW filter device.

FIG. 9 is a simplified flow chart of a method 900 for making a SAW filter device with beryllium IDT conductors.

The method 900 starts at 905 with a substrate or wafer of piezoelectric material and ends at 995 with a completed filter device. The substrate may be, for example, Y cut LiTaO₃ with a cut angle from 35 degrees to 55 degrees. The method 900 is similar to the conventional methods used to fabricate SAW filter devices with aluminum conductors. The flow chart of FIG. 9 includes only major process steps. Various conventional process steps (e.g. surface preparation, cleaning, inspection, baking, annealing, monitoring, testing, etc.) may be performed before, between, after, and during the steps shown in FIG. 9.

Forming IDT fingers in shallow grooves (as shown in FIG. 7C) increases the difference between the anti-resonance and resonance frequencies of a SAW resonator (as shown in FIG. 8) compared to resonators with the IDT conductors formed on the substrate surface. Such an increase in the difference between the anti-resonance and resonance frequencies may be useful in some, but not all, SAW filter devices. At 910, grooves may optionally be formed in the piezoelectric substrate by depositing photoresist on the substrate, patterning the photoresist to define the groove locations, and etching the grooves into the substrate to the desired depth. The grooves may be etched using, for example, inductively coupled plasma etching, reactive ion etching, or some other etching process. A SAW filter may have all IDT fingers formed in grooves or all IDT fingers formed on the surface of the substrate. A SAW filter may include a mixture of resonators with IDT fingers in grooves and resonators with IDT fingers on the surface of the substrate, The IDT conductor pattern is formed at 920 by depositing and patterning one or more metal layer including a substantially beryllium layer. Optionally, one or more layers of other materials may be disposed below (i.e. between the beryllium layer and the substrate) and/or on top of the beryllium layer. For example, a thin film of titanium or other metal may be used to improve the adhesion between the substantially beryllium layer and the substrate. A conduction enhancement layer of gold, aluminum, or other higher conductivity metal may be formed over the substantially beryllium layer to improve the average conductivity of the IDT conductor pattern.

The IDT conductor pattern may be formed at 920 by depositing a substantially beryllium layer and, optionally, one or more other metal layers in sequence over the surface of the substrate. The excess metal may then be removed by etching through patterned photoresist. The substantially beryllium layer can be etched, for example, by plasma etching, reactive ion etching, wet chemical etching, and other etching techniques. Other material layers (titanium, gold, aluminum, etc.), if present, can be etched using known processes for those materials.

Alternatively, the IDT conductor pattern may be formed at 920 using a lift-off process. Photoresist may be deposited over the substrate and patterned to define the IDT conductor locations. A substantially beryllium layer and, optionally, one or more other layers may be deposited in sequence over the surface of the substrate. The photoresist may then be removed, which removes the excess material, leaving the patterned IDT conductors.

After the IDT conductor pattern is formed at 920, the filter device may be completed at 930. The actions required at 920 to complete the device may be essentially the same for devices incorporating beryllium IDT conductors and devices with aluminum IDT conductors. Actions that may occur at 920 including depositing and patterning additional metal layers to form conductors other than the IDT conductor pattern; depositing an encapsulation/passivation layer such as $SiO_2$ or $Si_3O_4$ over all or a portion of the device; forming bonding pads or solder bumps or other means for making connection between the device and external circuitry; excising individual device die from a wafer containing multiple die; other packaging steps; and testing. After the filter device is completed, the process ends at 995.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A device comprising:
    a rotated Y-cut LiTaO3 piezoelectric substrate having a cut angle in a range of 35° to 45°; and
    a conductor pattern formed on a surface of the piezoelectric substrate, the conductor pattern including an interdigital transducer (IDT) of a surface acoustic wave (SAW) resonator, the SAW resonator oriented for an X propagation direction,
    wherein the conductor pattern includes a substantially beryllium layer formed proximate the surface of the piezoelectric substrate, and
    the cut angle and a thickness of the conductor pattern are collectively configured to maximize a Q-factor of the SAW resonator at a frequency near a resonant frequency of the SAW resonator.

2. The device of claim 1, wherein the substantially beryllium layer has a thickness defined by $0.05 \leq h/2p \leq 0.20$, where h is the substantially beryllium layer film thickness and p is a geometric period of the IDT.

3. The device of claim 1, wherein the conductor pattern includes one or more intervening layers between the substantially beryllium layer and the surface of the piezoelectric substrate.

4. The device of claim 3, wherein the one or more intervening layers include an adhesion layer.

5. The device of claim 1, wherein the conductor pattern includes a conduction enhancement layer over the substantially beryllium layer.

6. The device of claim 5, wherein the conduction enhancement layer is gold.

7. The device of claim 1, wherein at least a portion of the conductor pattern is formed in grooves in the piezoelectric substrate.

8. A method of fabricating an acoustic wave device comprising:
    forming a conductor pattern on a surface of a piezoelectric substrate, the conductor pattern including an interdigital transducer (IDT) of a surface acoustic wave (SAW) resonator, the SAW resonator is oriented for an X propagation direction
    wherein the conductor pattern includes a substantially beryllium layer proximate the surface of the piezoelectric substrate,
    the piezoelectric substrate is rotated Y-cut LiTaO3 with a cut angle in a range of 35° to 45°; and
    the cut angle and a thickness of the conductor pattern are collectively configured to maximize a Q-factor of the SAW resonator at a frequency near a resonant frequency of the SAW resonator.

9. The method of claim 8, wherein the substantially beryllium layer has a thickness defined by $0.05 \leq h/2p \leq 0.20$, where h is the substantially beryllium layer film thickness and p is the geometric period of the IDT.

10. The method of claim 8, wherein the conductor pattern includes the substantially beryllium layer and one or more layers of other materials between the substantially beryllium layer and the surface of the piezoelectric substrate.

11. The method of claim 10, wherein the one or more layers include an adhesion layer.

12. The method of claim 8, wherein the conductor pattern includes the substantially beryllium layer and a conduction enhancement layer over the substantially beryllium layer.

13. The method of claim 12, wherein the conduction enhancement layer is gold.

14. The method of claim 8, further comprising:
    prior to forming the conductor pattern, forming grooves in the surface of the substrate, wherein at least a portion of the conductor pattern is formed in the grooves.

15. A device comprising:
    a rotated Y-cut LiTaO3 piezoelectric substrate having a cut angle in a range of 45° to 50°; and
    a conductor pattern formed on a surface of the piezoelectric substrate, the conductor pattern including an interdigital transducer (IDT) of a surface acoustic wave (SAW) resonator, the SAW resonator oriented for an X propagation direction,
    wherein the conductor pattern includes a substantially beryllium layer formed proximate the surface of the piezoelectric substrate, and
    the cut angle and a thickness of the conductor pattern are collectively configured to maximize a Q-factor of the SAW resonator at a frequency near an anti-resonant frequency of the SAW resonator.

16. The device of claim 15, wherein the substantially beryllium layer has a thickness defined by $0.05 \leq h/2p \leq 0.20$, where h is the substantially beryllium layer film thickness and p is a geometric period of the IDT.

17. The device of claim 15, wherein the conductor pattern includes one or more intervening layers between the substantially beryllium layer and the surface of the piezoelectric substrate.

18. The device of claim 17, wherein the one or more intervening layers include an adhesion layer.

19. The device of claim 15, wherein the conductor pattern includes a conduction enhancement layer over the substantially beryllium layer.

20. The device of claim 19, wherein the conduction enhancement layer is gold.

21. The device of claim 15, wherein at least a portion of the conductor pattern is formed in grooves in the piezoelectric substrate.

22. A method of fabricating an acoustic wave device comprising:
forming a conductor pattern on a surface of a piezoelectric substrate, the conductor pattern including an interdigital transducer (IDT) of a surface acoustic wave (SAW) resonator, the SAW resonator is oriented for an X propagation direction
wherein the conductor pattern includes a substantially beryllium layer proximate the surface of the piezoelectric substrate,
the piezoelectric substrate is rotated Y-cut LiTaO3 with a cut angle in a range of 45° to 50°, and
the cut angle and a thickness of the conductor pattern are collectively configured to maximize a Q-factor of the SAW resonator at a frequency near an anti-resonant frequency of the SAW resonator.

23. The method of claim 22, wherein the substantially beryllium layer has a thickness defined by $0.05 \leq h/2p \leq 0.20$, where h is the substantially beryllium layer film thickness and p is the geometric period of the IDT.

24. The method of claim 22, wherein the conductor pattern includes the substantially beryllium layer and one or more layers of other materials between the substantially beryllium layer and the surface of the piezoelectric substrate.

25. The method of claim 24, wherein the one or more layers include an adhesion layer.

26. The method of claim 22, wherein the conductor pattern includes the substantially beryllium layer and a conduction enhancement layer over the substantially beryllium layer.

27. The method of claim 26, wherein the conduction enhancement layer is gold.

28. The method of claim 22, further comprising:
prior to forming the conductor pattern, forming grooves in the surface of the substrate,
wherein at least a portion of the conductor pattern is formed in the grooves.

* * * * *